United States Patent [19]
Yamada

[11] Patent Number: 4,563,094
[45] Date of Patent: Jan. 7, 1986

[54] METHOD AND APPARATUS FOR AUTOMATIC ALIGNMENT

[75] Inventor: Yasuyoshi Yamada, Tokyo, Japan

[73] Assignee: Canon Kabushiki Kaisha, Tokyo, Japan

[21] Appl. No.: 534,828

[22] Filed: Sep. 22, 1983

[30] Foreign Application Priority Data

Oct. 2, 1982 [JP]  Japan .................................. 57-173674

[51] Int. Cl.⁴ ............................................. G01B 11/00
[52] U.S. Cl. .................................... 356/401; 356/400; 350/6.8
[58] Field of Search ................. 356/400, 401; 250/548; 350/6.8

[56] References Cited
U.S. PATENT DOCUMENTS

| 4,167,677 | 9/1979 | Suzki ..................................... | 356/401 |
| 4,199,219 | 4/1980 | Suzki et al. ............................ | 350/6.1 |
| 4,277,178 | 7/1981 | Cushing et al. ....................... | 356/431 |
| 4,423,959 | 1/1984 | Nakazawa et al. ................... | 356/401 |

*Primary Examiner*—R. A. Rosenberger
*Attorney, Agent, or Firm*—Fitzpatrick, Cella, Harper & Scinto

[57] ABSTRACT

Two objects each having mark elements which extend in different directions are aligned. The mark elements are scanned by a linear slit-like illumination area, and the light reflected by the mark elements are used for the alignment. The direction or inclination of the linear-slit-like illumination area is changed, during one scanning deflection, to be in conformity with the mark elements.

14 Claims, 14 Drawing Figures

4,563,094

METHOD AND APPARATUS FOR AUTOMATIC ALIGNMENT

BACKGROUND OF THE INVENTION

1. Field of the Invention

The present invention relates to automatic alignment, and more particularly to a method and an apparatus for detecting the alignment of objects wherein a laser beam scans the objects to be aligned and is reflected by alignment marks to produce scattered light which is used for alignment, during production of semiconductor integrated circuits.

2. Description of the Prior Art

In this type of device, the practice has been to dispose a semiconductor wafer and a mask one above the other and scan their alignment marks to detect the position of the marks. For a better understanding of such a system, U.S. Pat. Nos. 4,167,677 and 4,199,219 and here referred to. The mask has an alignment mark, as shown in FIG. 1, (a), having first and second bar-like mark elements M1 and M2 which are spaced and parallel with each other but inclined ($\theta$) with respect to the scanning line A, and also having third and fourth bar-like mark elements M3 and M4 which are spaced and parallel with each other but inclined ($\theta$) oppositely with respect to the scanning line A. The wafer has an alignment mark, as shown in FIG. 2, (b), having first and second bar-like mark elements W1 and W2 which are inclined with respect to the scanning line A at the same angle $\theta$ but in different directions. Those marks of the mask and wafer are superimposed as shown in FIG. 1 (c) to achieve alignment therebetween. When the marks in the state of FIG. 1, (c) are scanned by a laser beam spot along the scanning line A, the beam is scatteredly reflected by the mark elements M1, M2, M3, M4, W1 and W2. The scattered light is received by a photoreceptor which produces pulse signals in response to the positions of the respective mark elements, as shown in FIG. 1, (d). The pulse signals are reformed into rectangular pulses by cutting the tops of the pulse signals at a suitable threshold V with the aid of a comparator. The reformed pulses are shown in FIG. 1, (e). The positional relationship between the wafer and the mask can be obtained from the time intervals between the mark elements. The wafer or mask is displaced in response to the positional relationship thus obtained so as to provide alignment therebetween.

Generally, scanning is effected by a spot of the laser beam. With a spot beam, erroneous or less accurate alignment can occur, when a piece of dust or an aluminium particle is present on the scanning line. In the case of semiconductor wafers in the manufacture of integrated circuits, alignment is required to a degree within microns or even to a degree within sub-microns. So in this field, the alignment is required to be of ultimate accuracy.

After the positions of the alignment marks are detected, the alignment drive is effected to the wafer and/or mask. It should be noted that it is seldom that one drive results in a correct alignment, usually the alignment operation is repeated several times. Also, in order to enhance the accuracy of the detection, the alignment marks are scanned several times to take an average result. Further, in the case of a step and repeat type aligner wherein the alignment operation is carried out for each shot, the alignment operation is executed tens of times for one wafer. Therefore, reduction of the time required for the alignment is highly desired in addition to the accuracy thereof.

SUMMARY OF THE INVENTION

It is the principal object of the present invention to detect the alignment marks efficiently, more particularly to reduce the time required for the detection.

It is another object of the present invention to increase the contact between an edge of the alignment mark and the illumination area of the scanning light to mitigate the deterioration of the signal which may be caused by a partial destruction of the mark edge.

It is a further object of the present invention to minimize the possibility of taking false signals, given by dust, evaporated particles or the like for true signals.

The present invention will be described in detail with a preferred embodiment which relates, as an example, to the relative alignment between a mask and a wafer. However, the invention also is applicable to the positional alignment for working an inspecting apparatus for a semiconductor device, a wire bonder or dicing machine, wherein the alignment is an absolute one with respect to a reference.

DESCRIPTION OF THE PREFERRED EMBODIMENTS

Figure 1A:
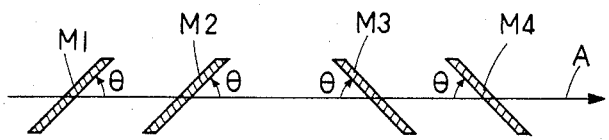
FIG. 1 shows conventional alignment marks of mask and wafer, wherein (a) shows the alignment mark of a mask; (b) shows the alignment mark of a wafer; (c) shows the state wherein the marks are superimposed; (d) shows the output signals produced as a result of scanning the marks of (c); and (e) shows the pulses reformed from the signals of (c).
Figure 1B:
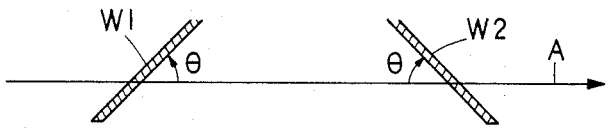
Figure 1C:
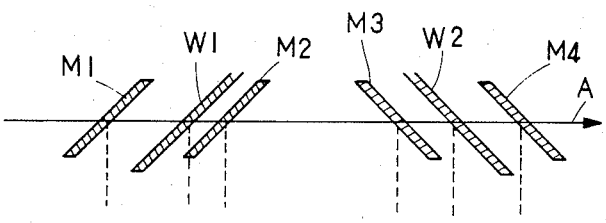
Figure 1D:
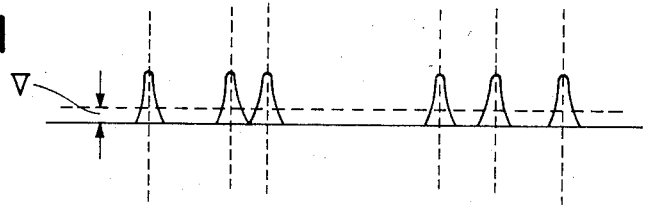
Figure 1E:
Figure 2:
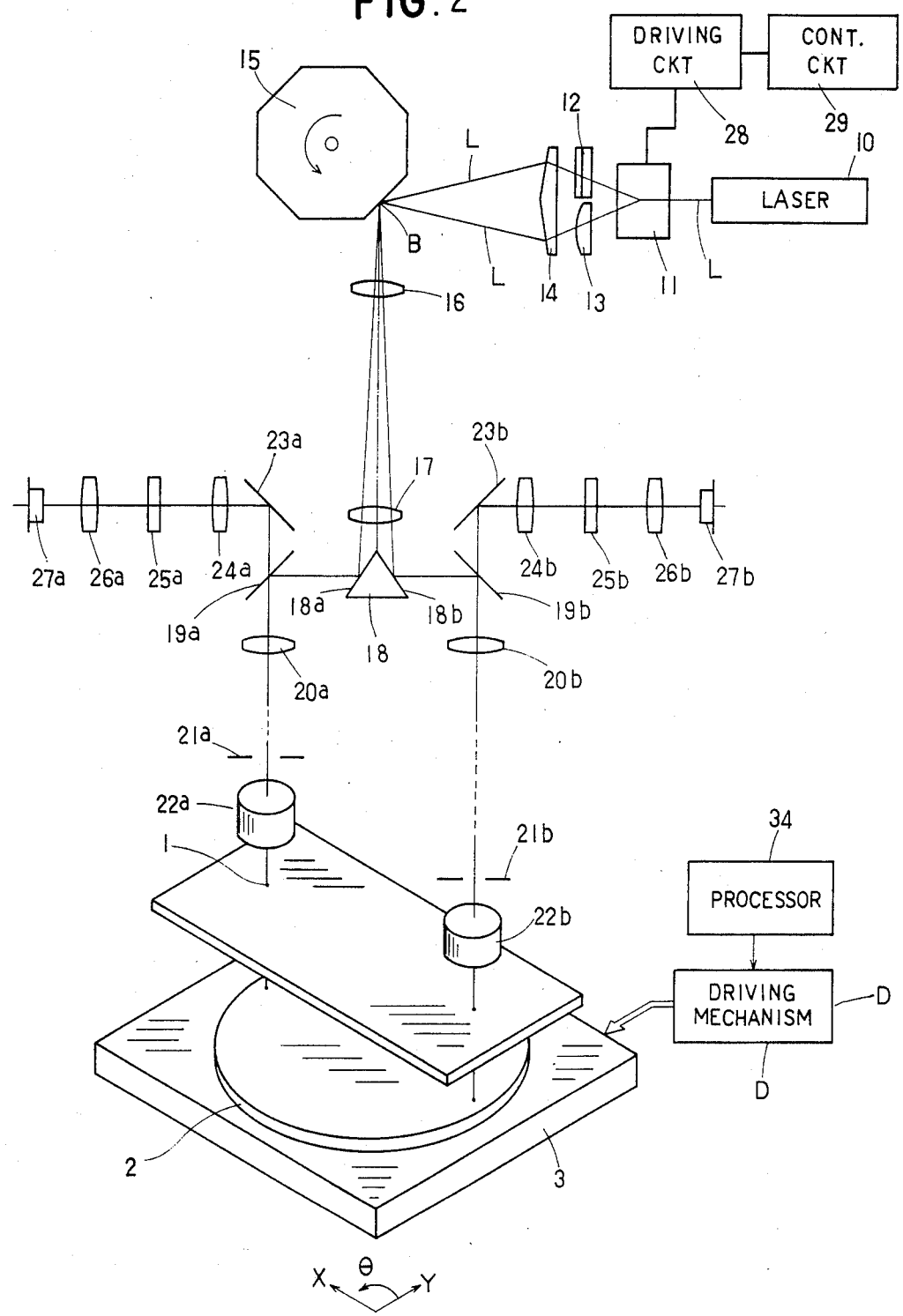
FIG. 2 shows an optical system according to an embodiment of the present invention.

Referring now to FIG. 2, an embodiment of the present invention, that is, an alignment and exposure system, wherein a mask 1 is held by a mask holder not shown. A wafer 2 is carried on a wafer stage 3. The mask 1 has alignment marks M at two different locations, and the wafer 2 has corresponding alignment marks W also at two different locations. The marks are as shown in FIG. 1, (a) and (b), which are superimposed as shown in FIG. 1 (c). The alignment and exposure system includes a laser beam source 10, a beam deflector 11, such as an acousto-optic element, juxtaposed cylindrical lenses 12 and 13 having respective power axes which are orthogonal, prism 14 and a rotatable polygonal mirror 15. The beam deflector 11, cylindrical lenses 12 and 13, prism 14 and polygonal mirror 15 are arranged in the order named along the channel of the laser beam L generated by the laser beam source 10. Along the channel of the laser beam L which has been scanningly reflected by the polygonal mirror 15, there are arranged intermediate lenses 16 and 17 and a prism 18 which deflects the laser beam in either of two orthogonal directions depending upon the angle of the mirror 15 deflection. At each side of the prism 18, there is provided a series of optical systems. These optical systems are symmetrical and include half mirrors 19a and 19b for deflecting the laser beam L and passing the beam reflected by the mask 1 and/or wafer 2 to a photorecptor, intermediate lenses 20a and 20b, aperture stops 21a and 21b and objective lenses 22a and 22b. On the optical path for the beam reflected by the mask 1 and/or wafer 2, there are provided after the half mirrors 19a and 19b, mirrors 23a and 23b, imaging lenses 24a and 24b, partial light blocking plates 25a and 25b which have central light blocking portions for filtering, condenser lenses 26a and 26b and photo-electric transducers 27a and 27b, which are all arranged symmetrically so as to form two symmetric two series of photoelectric detection optical systems.

The part of the optical system from the laser source 10 to the polygonal mirror 15 will be further explained. The laser beam L is selectively deflected to one of the two optical paths by the deflector 11, so that the laser beam L is incident on one of the cylindrical lenses 12 and 13, each of which has a condensing power in only one direction. The direction of one of the cylindrical lenses 12 and 13 is perpendicular to the direction of the other. The beam L which has passed through one of the cylindrical lens has a slit-like cross-section, since it has a power in only one direction. The laser beam L having a slit-like cross-section is refracted by a prism 14 to be incident on the polygonal mirror 15 surface at the position B as shown in FIG. 2. This applies both to the beam passed through the cylindrical lens 12 and the beam passed through the cylindrical lens 13. The beam deflector 11 is actuated by a driver 28 which is controlled by a controller 29.

Figure 3:
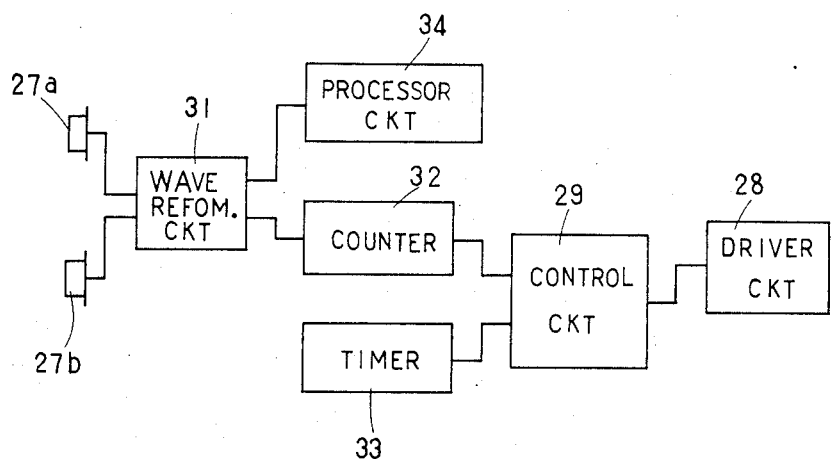
FIG. 3 is a block diagram of the control system for the optical system of FIG. 2.
Figure 4A:
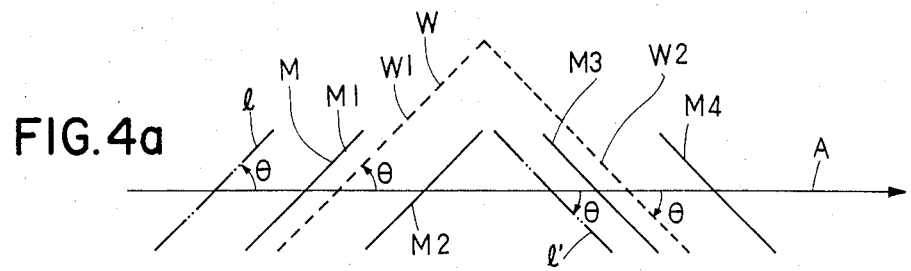
FIG. 4 shows the operation of an embodiment of the present invention wherein (a) shows an example of positions of alignment marks; (b), (c), (e) and (f) show the pulses obtained by the scanning, and (d) shows a period of time for a certain checking.
Figure 4B:
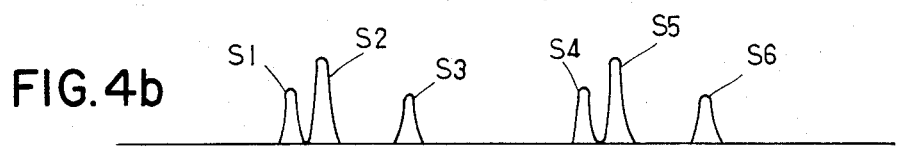
Figure 4C:
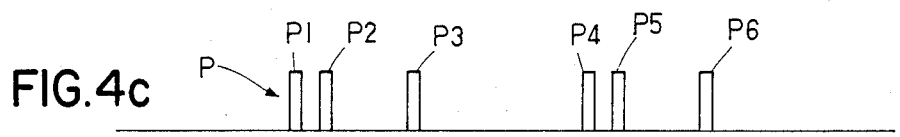
Figure 4D:
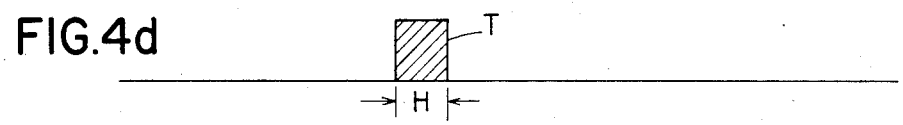
Figure 4E:
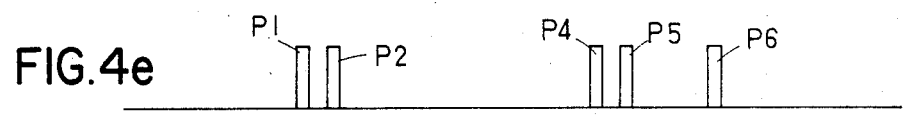
Figure 4F:
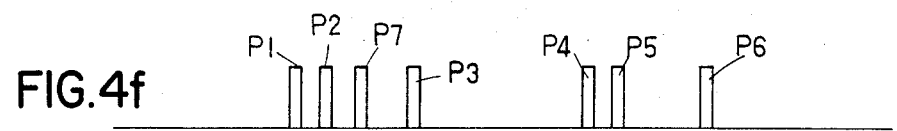

FIG. 3 is a block diagram of means for controlling the inclination of the area, illuminated by the laser beam on the surface to be scanned, in accordance with output signals of the photoelectric transducers 27a and 27b. The output of the photoelectric transducers 27a and 27b is conveyed through a wave reformation circuit 31 and a counter circuit 32 to the control circuit 29 described above. Also connected to the control circuit 29, is the output of a timer circuit 33. The control circuit 29 produces output to the light deflector 11 through the driving circuit 28 as described above. The pulse signals produced by the wave reformation circuit 31 are conveyed to a processing circuit 34 wherein the degree of the alignment is discriminated. In accordance with the output of the processing circuit, a driving mechanism D (FIG. 2) moves and/or rotates the wafer stage by the amount of misalignment obtained by the processing circuit 34 to bring the mask 1 and wafer 2 into alignment.

Since the embodiment of the present invention has the structures described above, the laser beam L generated by the laser beam source 10 takes one of the optical paths determined by the beams deflector 11 which is controlled by the control circuit 28, and the beam L is incident on the first cylindrical lens 12 to be reformed into a slit-like beam. The reformed beam is then refracted by the prism 14 to be incident on the origin B of deflection on the polygonal mirror 15, by which the beam is scanningly deflected. The beam L, after being deflected by the polygonal mirror 15, passes through the intermediate lenses 16 and 17 and reaches one of the inclined surfaces 18a of the prism 18, by which the beam is reflected leftwardly in FIG. 2, and then reflected at right angle downwardly by the half mirror 19a. The Beam L is then passed through the intermediate lens 20a, aperture stop 21a and the objective lens 22a to be imaged on the mask 1 and wafer 2. The orientation of the first cylindrical lens 12 is so determined that the slit-like illumination area, on the mask 1 or wafer 2, formed by the laser beam L incident thereon extends at angle 45°0 to the scanning line A as shown by reference character 1 on FIG. 4, (a) that is, substantially parallel to the alignment marks M1, W1 and M2. Thus, the beam L illuminates the first group of the alignment mark elements as a slit-like beam substantially parallel to those elements.

When the illumination slit 1 scans along the scanning line A, the beam is scatteredly reflected by the mark elements M1, W1 and M2. A part of the scattered light is directed back through the objective lens 22a, the aperture stop 21a, the intermediate lens 20a, the half mirror 19a, the imaging lens 24a, the partial light shield 25a and the condenser lens 26a, and finally reaches the photoelectric transducer 27a, which produces output signals S1, S2 and S3 as shown in FIG. 4, (b). It should be noted here that the illumination slit 1 formed by the reformed laser beam is substantially superimposed on the substantial length of each of the mark elements M1, W1 and M2, so that the sensitivity of the mark detection is much higher than conventional scanning by spot illumination, thus increasing the accuracy of the mark detection. The beam unscatteredly reflected by the flat or mirror surfaces of the mask 1 and wafer 2 is imaged on the central position of the blocking plate 25a so that such a beam does not reach the photoelectric transducer 27a.

The signals S1, S2 and S3 are inputted to the wave reformation circuit 31, and reformed into rectangular pulses P1, P2 and P3 as shown in FIG. 4, (c), with the pulse width equal to the width of signals S1, S2 and S3 cut at a predetermined threshold level. The pulses P1, P2 and P3 are given to the counter circuit 32 and processing circuit 34. When a predetermined number, three in the shown embodiment, are counted, a signal is given to the control circuit 29. To the control circuit 29, another signal T is applied from the timer circuit 33. The signal T is the one applied at a predetermined timing and with a predetermined width H, as shown in FIG. 4, (d). When the third pulse P3 is within the time period of H, the control circuit 29 generates a signal to actuate the driving circuit 28 to change the beam L channel to the other optical path by the deflector 11. By this, the laser beam L becomes incident on the other cylindrical lens, i.e., the second cylindrical lens 13. As described above, the power axis of the second cylindrical lens 13 is inclined at a predetermined angle with respect to that of the first cylindrical lens 12. So, the direction of the slit-like illumination area on the mask and wafer changes to the state as shown by the reference character 1' in FIG. 4, (a). That is, the illumination area is at 135° to the scanning axis and substantially parallel with the mark elements M3, W2 and M4.

At the same time with the change, the direction of the beam incident on mirror 15 changes so that the direction of the beam L reflected by the prism 14 also changes. Therefore, the scanning line is not continuous, at the point of the optical path change. It is preferable to determine the distance between the mark elements corresponding to the interval, or to determine the inclination of the prism 14 surface to fly the slit-like illumination area backwardly.

The mark elements M3, W2 and M4 are scanned by the slit-like illumination area l' having the different inclination. Similarly to the above described operation, the photoelectric transducer 27a produces the output signals S4, S5 and S6 as shown in FIG. 4, (b), and the wave reformation circuit 31 produces pulses P4, P5 and P6 as shown in FIG. 4, (c). With this, the detection of the first group of mark elements finishes. If desired, the pulses are processed together with the pulses P1, P2 and P3 previously obtained to determine the state of alignment.

If, on the other hand, the third pulse P3 is not generated during the time period T, that is, the mark element M2 is not detected, the control circuit actuates the driving circuit 28 to change the optical path, after the point of time within which the third pulse should have been produced. By this, the inclination of the slit-like illumination area is changes even if the third pulse is not generated. In this case, the pulses transmitted from the wave reforming circuit 31 to the processing circuit 34 are as shown in FIG. 4, (e), since the third pulse is missing.

It is possible, because of the existence of dust or other foreign matter, that larger than a predetermined number of pulses is produced. An example of this is shown in FIG. 4, (f). The pulse P7 is shown as having been produced by something other than the marks M and W. On this occasion, it is not proper to change the optical path as soon as the third pulse P7 is detected. To prevent this, the time period H is provided, so that the optical path change takes place only when the third pulse is detected during the period H, or after the period has elapsed.

As will be apparent from the foregoing, the direction of the slit-like illumination area changes during one scanning operation of the marks M (M1, M2 and M3) and W (W1 and W2). That is, the change takes place during the period the beam L is being deflected in one direction. This saves time, since it is not necessary to effect scanning operation in the manner that the beam is first deflected through its full span to scan the object with a first slit-like illumination area, and then the beam is changes to provide a second slit-like illumination area, whereafter the beam repeats the full span deflection to scan the object with the second slit-like illumination area.

The laser beam further continues to be deflected by the polygonal mirror 15. The beam L reaches the other inclined surface 18b of the prism 18. Then, the beam L is reflected rightwardly to pass through the intermediate lens 20b, the aperture stop 21b and the objective lens 22b and reach the mask 1 and wafer 2 at the second group of alignment mark elements. And the detecting operation is carried out in the similar manner as described above.

Figure 5:
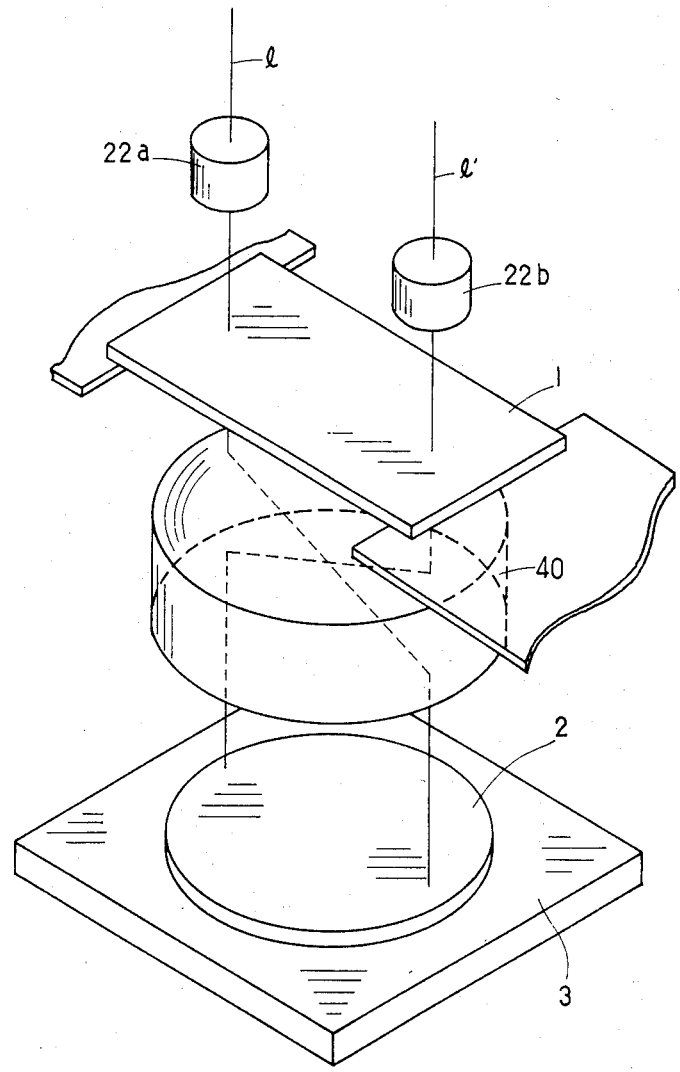
FIG. 5 is a perspective view of a part of a device according to another embodiment of the present invention.

In a projection type alignment and exposure system, a large projection lens 40 is provided between the mask 1 and wafer 2, as shown in FIG. 5. The laser beam L emitted from the laser source 10 is imaged on the mask 1 by objective lenses 22a and 22b, and on the wafer 2 by the projection lens. Since the principal ray of the laser beam L passes through the center of the projection lens 40, the scanning operation is first effected on the second group of the mark elements and then on the first group of the mask elements, as opposite to the case, described hereinbefore, wherein the mask 1 and the wafer 2 are contacted.

Although the foregoing explanation has been made with respect to an alignment and exposure apparatus, more particularly, a mask aligner, it is understood that the present invention is applicable to other objects, such as the master alignment in a printing field.

It is possible to use an electro-optic element in place of the acousto-optic element.

According to the present invention, described in detail hereinbefore, the following advantages are provided:

(1) The illumination beam has a slit-like cross-section having an inclination corresponding to that of the mark element, so that signal-to-noise ratio is improved, resulting in better detection sensitivity. Even if some foreign matters is present around the mark, the light scattered by them is not detected; and (2) The inclination of and the slit-like illumination area can be changed during one scanning, the number of scanning operations is minimized.

While the invention has been described with reference to the structures disclosed herein, it is not confined to the details set forth and this application is intended to cover such modifications or changes as may come within the purposes of the improvements or the scope of the following claims.

What is claimed is:

1. A scanning apparatus comprising in combination:
   producing means for selectively producing a first light beam of a slit-like cross-section extending in one direction and a second light beam of a slit-like cross-section extending in another direction;
   deflecting means for receiving the first light beam and the second light beam from said beam producing means and deflecting each to scan a surface to be scanned and be reflected thereby;
   control means for actuating said producing means to change from producing said first light beam to producing said second light beam during one scanning deflection operation by said deflecting means after the start of said one scanning deflection operation and before the end of said one scanning deflection operation; and
   receiving means for receiving the beam reflected by the surface to be scanned and generating at least one detection signal therefrom.

2. An apparatus according to claim 1, wherein said control means actuates said producing means to make said change as aforesaid when a predetermined number of detection signals is generated after the start of said one scanning deflection operation.

3. An apparatus according to claim 1, wherein said control means actuates said producing means to make said change as aforesaid after a predetermined delay from the start of said one scanning deflection operation.

4. An apparatus according to claim 1, wherein said deflecting means deflects the first and second light beam to scan two different portions of the surface continuously, and during the one deflection scanning operation, said control means actuates said producing means to change between producing the first light beam and producing the second light beam three times.

5. An apparatus according to claim 1, wherein said producing means includes a beam source and a beam modulating element.

6. An apparatus according to claim 5, wherein said beam modulating means includes an acousto-optic element.

7. A method of aligning a first object having a first alignment mark formed by a plurality of first mark elements extending in different directions and a second object having a second alignment mark formed by a plurality of second mark elements extending in different directions, comprising the steps of:
- holding the first and second objects in optically parallel relation;
- selectively producing a first light beam of a slit-like cross-section extending in one direction and a second light beam of a slit-like cross-section extending in another direction;
- projecting the first light beam onto the first and second objects to form an illuminated slit-like area extending substantially parallel with a part of the first and second mark elements, and deflecting said first light beam to scan the first and second objects;
- stopping the projection of the first light beam and projecting the second light beam during one scanning deflection operation after the start of the one scanning deflection operation and before the end of the same scanning deflection operation to make the illuminated area on said first and second objects substantially parallel with the remainder of the first and second mark elements; and
- receiving the beam reflected by the first and second alignment marks and causing relative movement between the first and second objects to achieve alignment therebetween.

8. An automatic alignment apparatus for aligning a first object having a first alignment mark formed by a plurality of first mark elements extending in different directions and a second object having a second alignment mark formed by a plurality of second mark elements extending in different directions, comprising:
- first holding means for holding the first object;
- second holding means for holding the second object;
- producing means for selectively producing a first light beam of a slit-like cross-section extending in one direction and a second light beam of a slit-like cross-section extending in another direction;
- deflecting means for receiving the first and second light beams from said beam producing means and deflecting each to scan the first and second alignment marks of the first and second objects and be reflected by said first and second objects;
- control means for controlling said producing means to change from producing the first light beam to producing the second light beam during one scanning deflection operation by said deflecting means after the start of the one scanning deflection and before the end of the one scanning deflection;
- receiving means for receiving the beam reflected by the first and second objects and generating at least one detection signal; and
- means for causing a relative movement between said first holding means and said second holding means in accordance with the detection signal.

9. An apparatus according to claim 8, further comprising a projection optical system, with respect to which the first and second objects are optically conjugate.

10. An apparatus according to claim 8, wherein said producing means includes a light beam generator, and modulating means for modulating the beam generated by the beam generator.

11. An apparatus according to claim 10, wherein said modulating means includes an acousto-optic element.

12. An apparatus according to claim 10, wherein said control means receives the detection signal from said receiving means to effect control of said producing means to change from producing the first light beam to producing second light beam.

13. An apparatus according to claim 12, wherein said control means controls said producing means to change from producing the first light beam to producing the second light beam when a predetermined number of detection signals are received from said receiving means.

14. An apparatus according to claim 8, wherein said control means controls said producing means to change from producing the first light beam to producing the second light beam a predetermined time after the start of the one scanning detection operation.

* * * * *

UNITED STATES PATENT AND TRADEMARK OFFICE
CERTIFICATE OF CORRECTION

PATENT NO. : 4,563,094
DATED : January 7, 1986
INVENTOR(S) : YASUYOSHI YAMADA

It is certified that error appears in the above-identified patent and that said Letters Patent is hereby corrected as shown below:

Column 1, lines 51-52, change "alumin-ium" to --aluminum--.

Column 2, line 49, change "Referringnow" to --Referring now--.

Column 3, line 7, change "photorecptor," to --photoreceptor--;
line 15, change "photo-electric" to --photoelectric--;
line 17, change "symmetric two series" to --symmetric series--;
line 27, change "cylindrical lens" to --cylindrical lenses--; and
line 58, change "beams deflector" to --beam deflector--.

Column 4, line 7, change "45°0 to" to --45°--.

Column 5, line 3, change "above described" to --above-described--;
line 18, change "is changes" to --is changed--; and
line 42, change "is changes" to --is changed--.

UNITED STATES PATENT AND TRADEMARK OFFICE
CERTIFICATE OF CORRECTION

PATENT NO. : 4,563,094
DATED : January 7, 1986
INVENTOR(S) : YASUYOSHI YAMADA

It is certified that error appears in the above-identified patent and that said Letters Patent is hereby corrected as shown below:

Column 6, line 13, change "matters is" to --matter is--;

line 14, change "by them is" to --by it is--;

line 15, change "of and the" to --of the--; and line 16, change "scanning, the" to --scanning, and the--.

Column 8, line 29, change "producing second" to --producing the second--.

Signed and Sealed this

Nineteenth Day of August 1986

[SEAL]

Attest:

DONALD J. QUIGG

Attesting Officer      Commissioner of Patents and Trademarks